(12) United States Patent
Chen (10) Patent No.: US 6,900,913 B2
(45) Date of Patent: May 31, 2005

(54) IMAGE PICKUP MODULE (76) Inventor: Wen-Ching Chen, 2F, No. 258, Yung Yi Road, Tai-Ping City, Taichung Hsien (TW)

( * ) Notice: Subject to any disclaimer, the term of this patent is extended or adjusted under 35 U.S.C. 154(b) by 494 days.

(21) Appl. No.: 09/766,623

(22) Filed: Jan. 23, 2001

(65) Prior Publication Data
US 2002/0097453 A1 Jul. 25, 2002

(51) Int. Cl.$^7$ ................................................ H04N 1/04
(52) U.S. Cl. ...................... 358/474; 358/475; 358/509; 358/482; 358/473; 358/909.1; 348/311; 348/243; 348/274; 359/819
(58) Field of Search ................................. 358/474, 475, 358/482, 487, 509, 473, 483, 909.1; 348/311, 243, 274, 335, 340, 345, 374; 359/819

(56) References Cited

U.S. PATENT DOCUMENTS

| | | | | |
|---|---|---|---|---|
| 4,281,895 A | * | 8/1981 | Mohr | 359/827 |
| 4,491,865 A | * | 1/1985 | Danna | 358/98 |
| 4,534,624 A | * | 8/1985 | Toda et al. | 350/429 |
| 4,676,605 A | * | 6/1987 | Toda et al. | 350/429 |
| 5,327,188 A | * | 7/1994 | Kohmoto | 396/103 |
| 6,066,090 A | * | 5/2000 | Yoon | 600/113 |
| 6,115,187 A | * | 9/2000 | Tabata et al. | 359/654 |
| 6,160,641 A | * | 12/2000 | Kaneko et al. | 358/475 |
| 6,215,604 B1 | * | 4/2001 | Hori | 359/819 |
| 6,359,740 B1 | * | 3/2002 | Tsuchiya | 359/819 |
| 6,393,218 B1 | * | 5/2002 | Iwasaki et al. | 396/79 |

* cited by examiner

Primary Examiner—Kimberly Williams
Assistant Examiner—Negussie Worku
(74) Attorney, Agent, or Firm—Rosenberg, Klein & Lee (57) ABSTRACT A CCD and CMOS image pickup module including a circuit main board on which an image sensor (CMOS, CCD) and relevant electronic elements are laid. A lens seat is disposed on an upper edge of a package of the image sensor. The lens seat has an image pickup cylinder correspondingly positioned above a coupling transistor of the image sensor. The lens seat covers and encloses the image sensor with the connecting section of the bottom of the image pickup cylinder sealedly attaching to the periphery of the top face of the package of the image sensor. With the profile of the outer periphery of the package of the image sensor serving as a normal standard for the axis of the lens, the axis of the lens being projected onto the sensor center of the coupling transistor.

3 Claims, 8 Drawing Sheets

IMAGE PICKUP MODULE

BACKGROUND OF THE INVENTION

The present invention is related to a CCD and CMOS image pickup module, and more particularly to an image pickup module in which by means of the high precision of the surface of the package of the image sensor, the axis of the lens will not deflect from the image sensor so that image deflection can be avoided.

Figure 6:
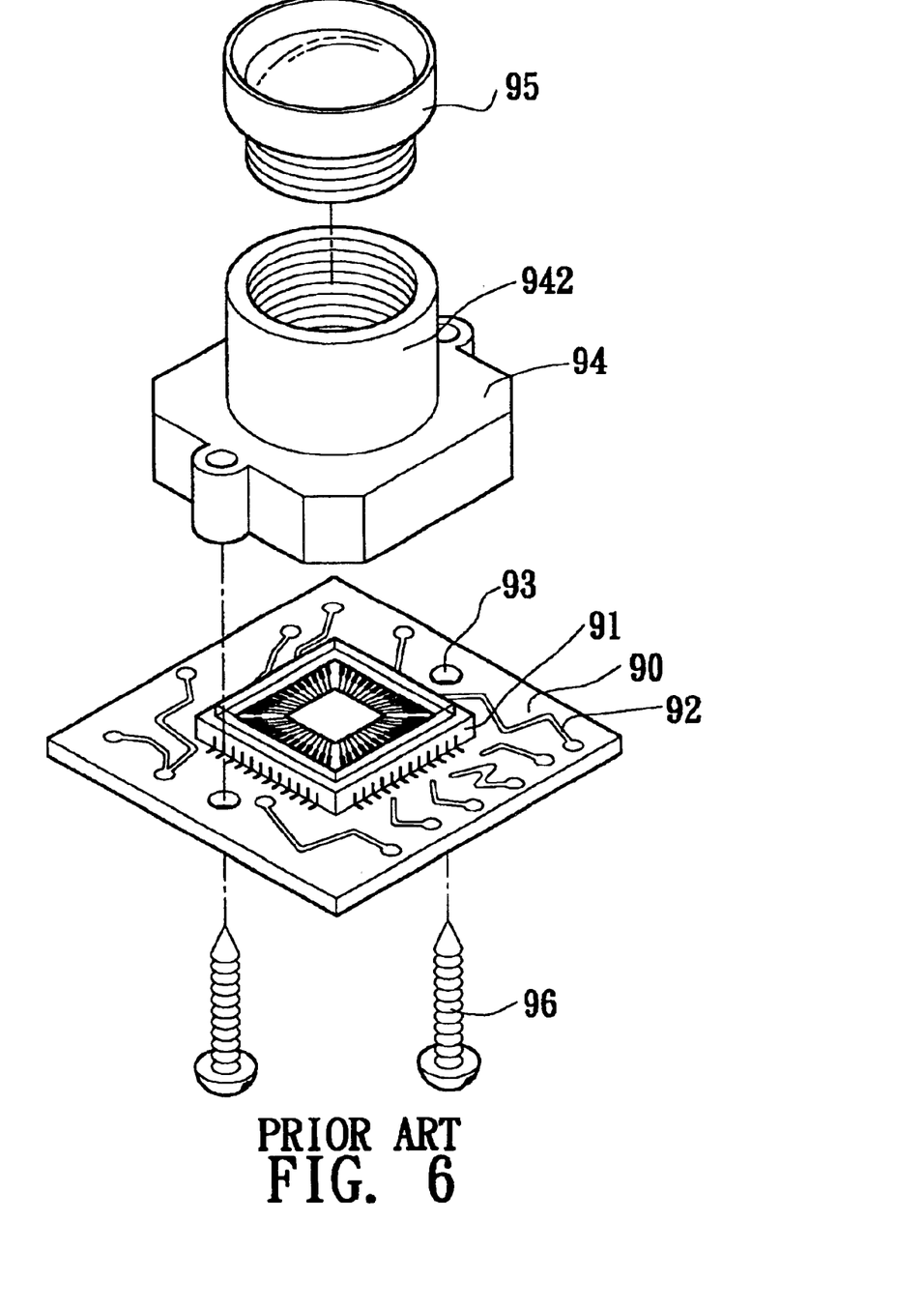
FIG. 6 is a perspective exploded view of a conventional CCD image pickup module.

FIG. 6 shows a conventional CCD image pickup module. A CCD image sensor 91 and relevant electronic circuit 92 are laid on a circuit main board 90. A coupling transistor is disposed at the center of the image sensor 91. Two fixing holes 93 are formed on two sides of the image sensor 91. Screws 96 are passed through the fixing holes 93 and screwed into two thread holes 942 on two sides of a lens seat 94 to lock the lens seat 94 on the circuit main board 90. A lens 95 is screwed in the lens seat 94.

Figure 8:
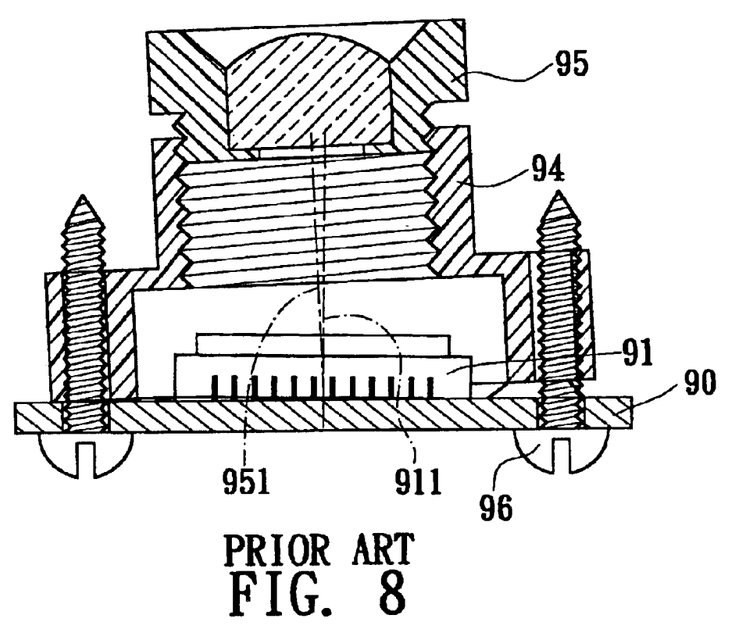
FIG. 8 is a sectional assembled view of the conventional CCD image pickup module, showing the deflection of the axis of the lens.

The electronic circuit 92 is laid over the circuit main board 90. The electronic circuit 92 itself has a certain thickness. In addition, after soldered, the soldering points will protrude beyond the circuit main body 90. Therefore, there is a difference in height between the electronic circuit 92 and the soldering points. As a result, when locking the lens seat 94, the axis 951 of the lens will be deflected from the sensor center 911 of the image sensor 91 (as shown in FIG. 8 ). This leads to image deflection and distorts the image.

Figure 7:
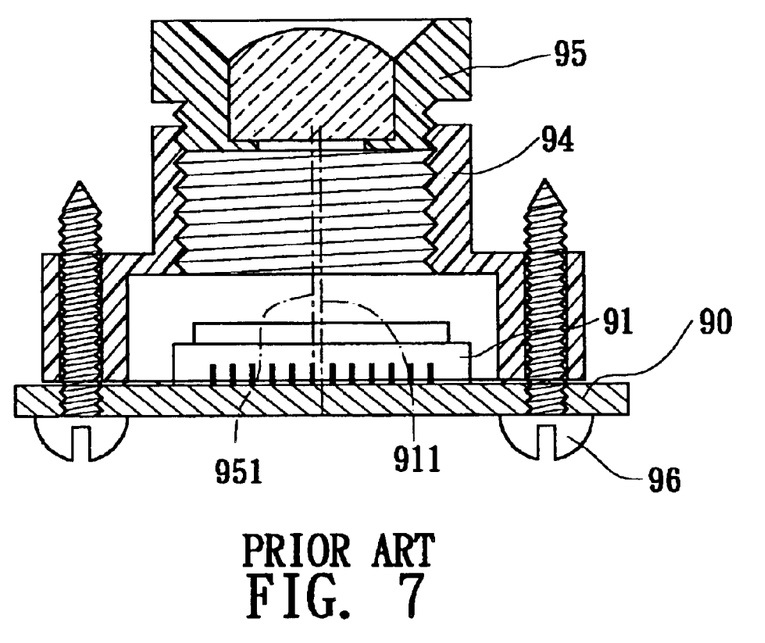
FIG. 7 is a sectional assembled view of the conventional CCD image pickup module, showing the displacement of the axis of the lens.

Moreover, when fixing the lens seat 94, the image sensor 91 is enclosed by the lens seat 94. Therefore, it is hard to ensure that the lens 95 is lined up with the sensor center 911 of the image sensor 91 (as shown in FIG. 7). It is known that after focused by the lens 95, the central part of the image will have higher resolution, while the peripheral part of the image will be relatively distorted. In addition, only the image falling onto the central image pickup unit 911 of the image sensor 91 will be picked up and presented. In the case that the axis 951 of the lens 95 is displaced from the sensor center of the image sensor 91, the relatively distorted image will fall onto the image pickup unit 911 so that the image will have an image deflection and can be hardly clearly presented.

In addition, two sides of the lens seat 94 are formed with thread holes 942 for the screws 96 to lock the lens seat 94. Therefore, the volume of the lens seat 94 cannot be reduced. This results in inconvenience in design and use of the product.

SUMMARY OF THE INVENTION

It is therefore a primary object of the present invention to provide a CCD and CMOS image pickup module in which the outer edges of the lens seat and the image sensor are flush with each other and the bottom face of the lens seat and the top face of the image sensor contact with each other on a plane face. Therefore, the axis of the lens will not be displaced or deflected from image sensor so as to avoid image deflection.

It is a further object of the present invention to provide the above CCD and CMOS image pickup module having reduced volume so that the design and use of the image pickup module is facilitated.

The present invention can be best understood through the following description and accompanying drawings wherein:

DETAILED DESCRIPTION OF THE PREFERRED EMBODIMENTS

Figure 1:
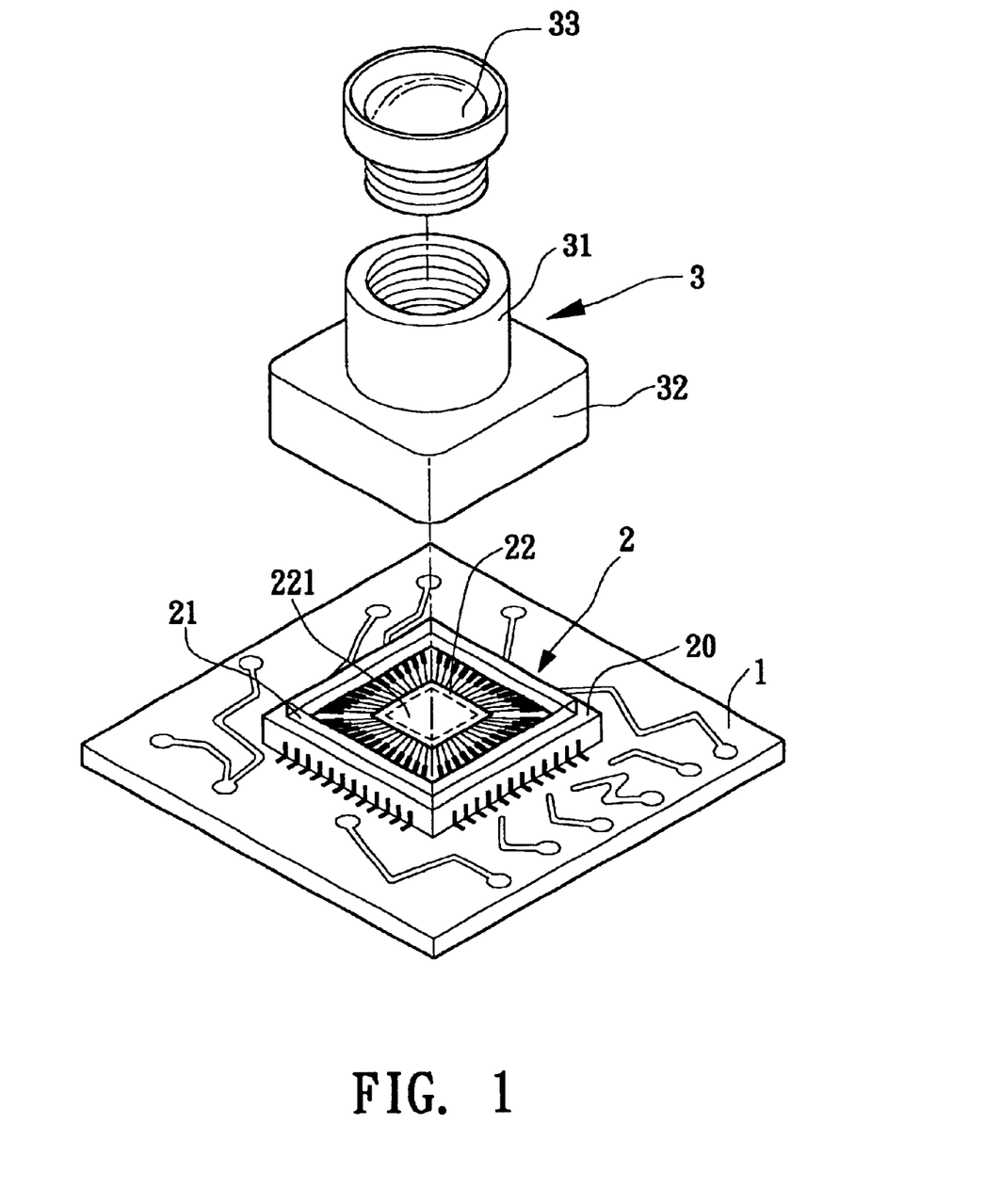
FIG. 1 is a perspective exploded view of a first embodiment of the present invention.
Figure 2:
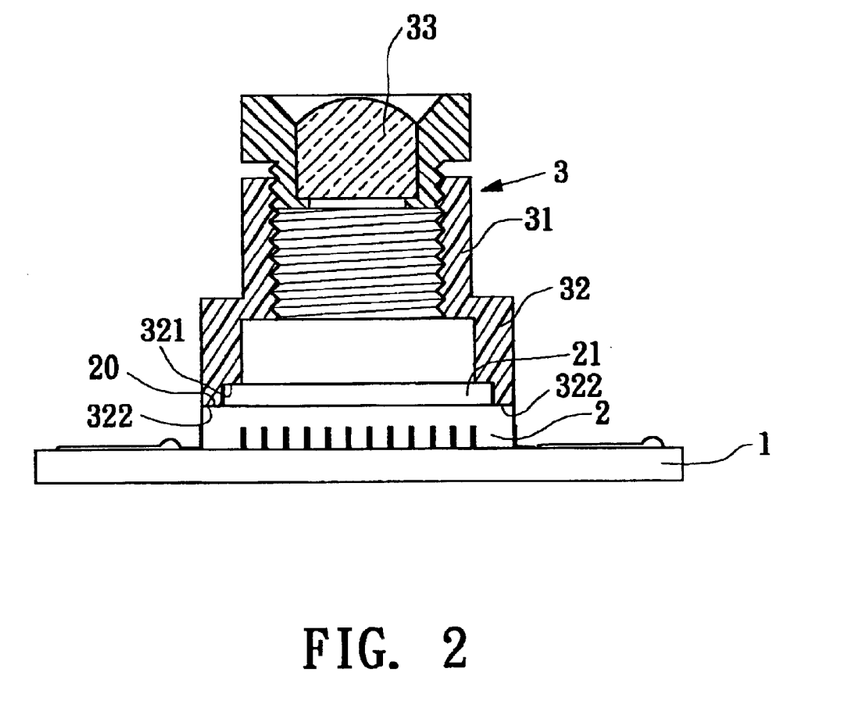
FIG. 2 is a sectional assembled view of the first embodiment of the present invention.

Please refer to FIGS. 1 and 2. According to a first embodiment of the present invention, the image pickup module includes a circuit main board 1 on which an image sensor 2 (CMOS, CCD) and relevant electronic elements are laid. A lens seat 3 is disposed on the upper edge of the package of the image sensor 2.

The upper package of the image sensor 2 includes a sealing glass sheet 21. The outer periphery of the glass sheet 21 is slightly smaller than the profile of the package of the image sensor 2, whereby a plane section 20 free from covering of the glass sheet 21 is left on the periphery of top face of the image sensor 2.

The lens seat 3 has an image pickup cylinder 31 correspondingly positioned above and at least covering the coupling transistor 22 of the image sensor 2. A connecting section 32 is formed on the bottom of the image pickup cylinder 31. The outer periphery of the connecting section 32 has a dimension equal to that of the outer periphery of the image sensor 3. The inner periphery of the bottom face of the connecting section 32 is formed with a stepped section having a first end face 322 and a second end face 321. The inner periphery of the first end face 322 has a dimension slightly larger than that of the outer periphery of the glass sheet 21. The inner periphery of the second end face 321 has a dimension slightly smaller than that of the outer periphery of the glass sheet 21. The first and second end faces 322, 321 of the lens seat 3 are respectively connected with the plane section 20 of the periphery of top face of the image sensor and the top face of the glass sheet 21.

The lens seat 3 covers and encloses the image sensor 2 with the connecting section 32 sealedly attaching to the periphery of the top face of the package of the image sensor 2. With the profile of the outer periphery of the package of the image sensor 2 serving as a normal standard for the axis of the lens 33, an auxiliary locating unit (not shown) is co-used to project the axis of the lens 33 onto the sensor center 221 of the coupling transistor 22.

When manufacturing and packaging the image sensor 2, the surface and dimension thereof have very high precision. Therefore, when mounting the lens seat, a device or other auxiliary locating unit can be used to aim the lens seat 3 at the outer periphery of the image sensor 2. The first and second end faces 322, 321 of the lens seat 3 are respectively adhered to the plane section 20 of the periphery of top face of the image sensor and the top face of the glass sheet 21. The outer edges of the lens seat and the image sensor are flush with each other so that the axis of the lens will not be displaced from the sensor center 221 of the coupling transistor 22 of the image sensor. The plane section 20 of the periphery of top face of the image sensor and the top face of the glass sheet 21 and the first and second end faces 322, 321 of the lens seat 3 all are plane faces with very high precision. Therefore, after adhered, the axis of the lens will not be deflected from the center of the image sensor so that no image deflection will take place.

The design of the lens seat of the present invention can be modified to meet various types and specifications of image sensors.

Figure 3:
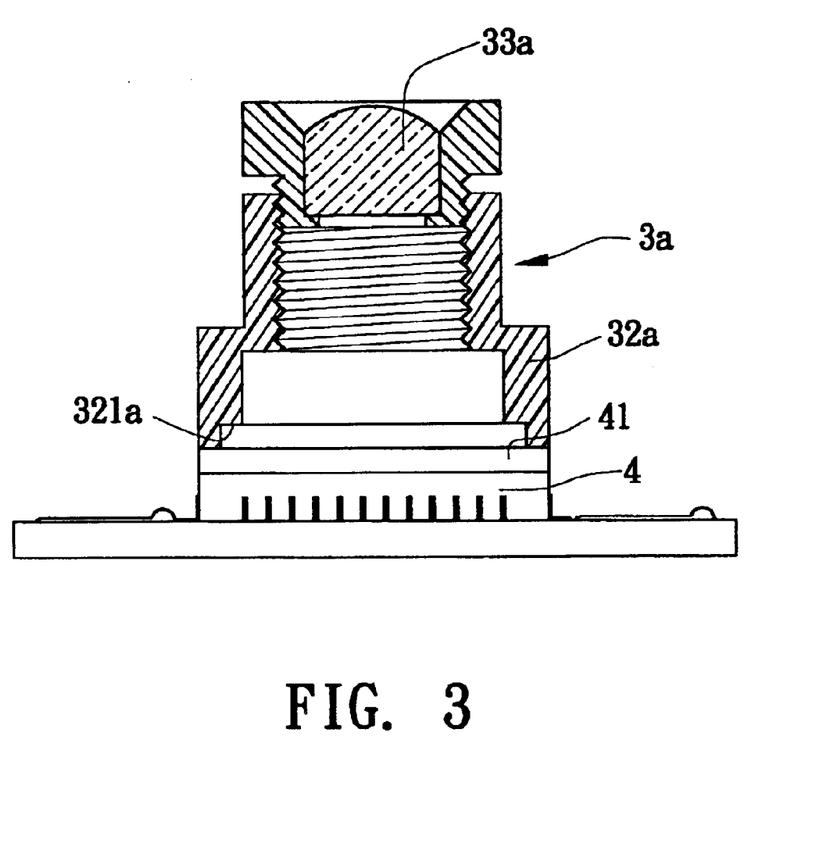
FIG. 3 is a sectional assembled view of a second embodiment of the present invention.

FIG. 3 shows a second embodiment of the present invention, in which the top package of the image sensor 4 (CMOS, CCD) includes a sealing glass sheet 41. The outer periphery of the glass sheet 41 is overlaid on and flush with the profile of the package of the image sensor 4. The inner periphery of the bottom face of the connecting section 32a of the lens seat is formed with a step face 321a. The inner periphery of the step face 321a has a dimension slightly smaller than that of the outer periphery of the glass sheet 41. The step face 321a is attached to the periphery of the top face of the glass sheet 41. With the profile of the outer periphery of the package of the image sensor 4 serving as a standard for the outer periphery of the step face 321a, the axis of the lens 33a is projected onto the sensor center of the coupling transistor.

Figure 4:
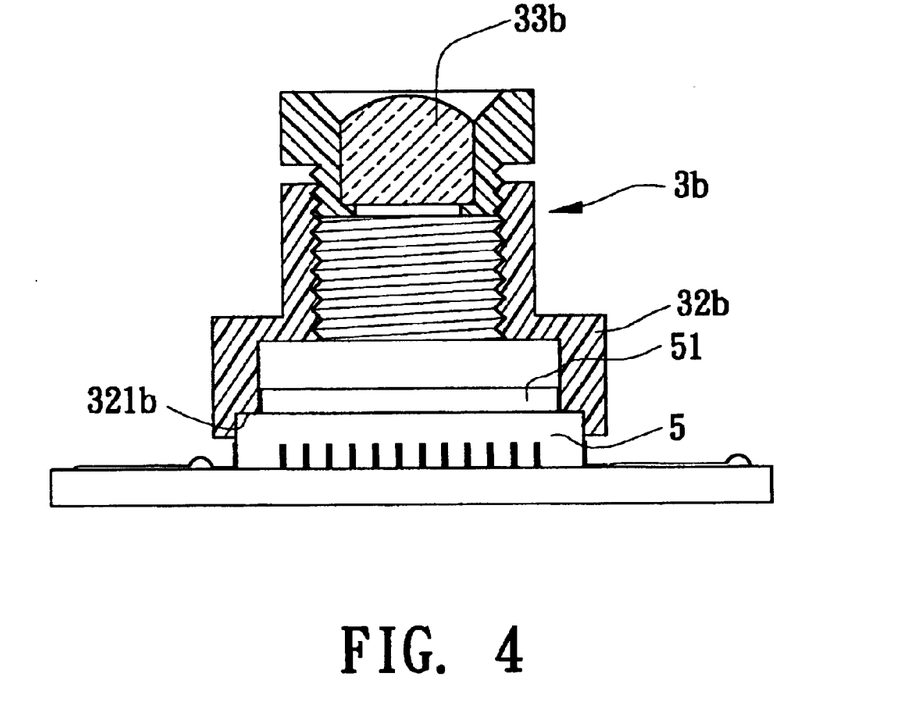
FIG. 4 is a sectional assembled view of a third embodiment of the present invention.

FIG. 4 shows a third embodiment of the present invention, in which the top package of the image sensor 5 (CMOS, CCD) includes a sealing glass sheet 51. The outer periphery of the glass sheet 51 is slightly smaller than the profile of the package of the image sensor 5. The inner periphery of the bottom face of the connecting section 32b of the lens seat is formed with a step face 321b. The inner periphery of the step face 321b has such a dimension as to encompass the entire glass sheet 51. With the profile of the outer periphery of the package of the image sensor 5 serving as a standard for the outer periphery of the step face 321b, the axis of the lens 33b is projected onto the sensor center of the coupling transistor.

Figure 5:
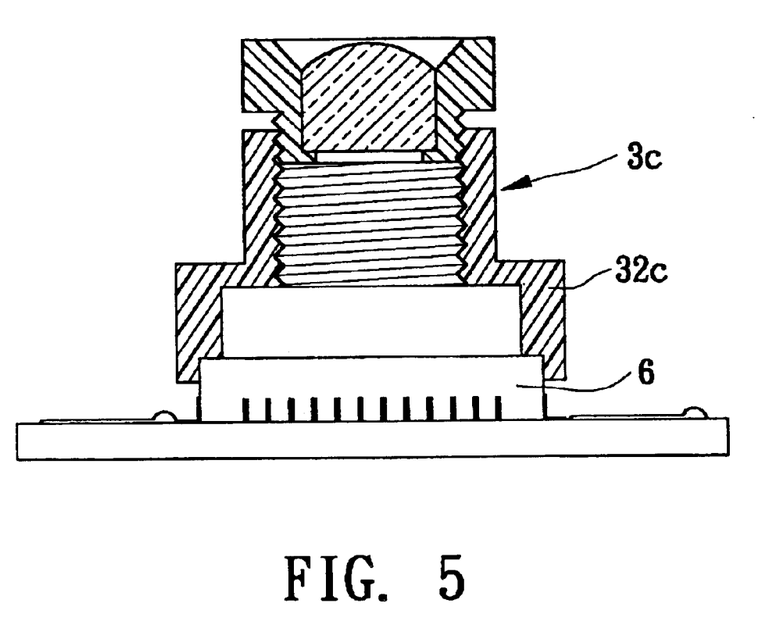
FIG. 5 is a sectional assembled view of the fourth embodiment of the present invention.

FIG. 5 shows a fourth embodiment of the present invention, in which the lens seat 3c covers and encloses the image sensor 6 (CMOS, CCD) to serve as a top package of the image sensor 6. The connecting section 32c of the lens seat outward extends to encompass the outer periphery of the package of the image sensor 6. With the profile of the outer periphery of the package of the image sensor 6 serving as a standard, the axis of the lens is projected onto the sensor center of the coupling transistor. With such measure, the sealing glass sheet is omitted during packaging so that the production efficiency can be promoted.

In conclusion, with the high precision of the package of the image sensor, the lens seat is adhered to the upper edge of the package, whereby the axis of the lens will not deflect from the image sensor and the axis of the lens will project onto the sensor center of the coupling transistor of the image sensor so as to avoid image deflection. Moreover, it is no more necessary to tighten two sides of the lens seat with screws so that the volume can be reduced. This facilitates design and use of the image pickup module.

The above embodiments are only used to illustrate the present invention, not intended to limit the scope thereof.

Many modifications of the above embodiments can be made without departing from the spirit of the present invention.

What is claimed is:

1. An image pickup module comprising:

a circuit main board;

an image sensor coupled to said circuit main board, said image sensor including a coupling transistor device disposed within a housing package of said image sensor having a peripheral side edge circumscribing said housing package;

a lens seat disposed on said image sensor and being spaced from said circuit main board, said lens seat including a connecting section and an image pickup cylinder section extending therefrom, said connecting section engaging said peripheral side edge of said image sensor housing package to thereby be located in an aligned position; and, a lens coupled to said image pickup cylinder section of said lens seat, said lens having an axis aligned with said coupling transistor device when said connecting section of said lens seat is disposed in said aligned position.

2. An image pickup module comprising:

a circuit main board;

an image sensor coupled to said circuit main board, said image sensor including a coupling transistor device disposed within a housing package of said image sensor, said housing package having a length and a width dimension defined between opposing peripheral sides thereof;

a lens seat disposed on said image sensor and being spaced from said circuit main board, said lens seat including (a) a connecting section having a length and a width dimension defined between opposing peripheral sides thereof, said length and width dimensions of said connecting section being respectively equal to said length and width dimensions of said housing package of said image sensor, said connecting section being disposed in contiguous contact with a peripheral edge portion of an upper surface of said housing package and having said peripheral sides thereof being aligned with said peripheral sides of said housing package to thereby locate said lens seat in an aligned position, said connecting section having formed thereon first and second end faces defining an inner flange portion to retentively engage a peripheral portion of said image sensor housing package, and (b) an image pickup cylinder section extending from said connecting section; and a lens coupled to said image pickup cylinder section of said lens seat, said lens having an axis aligned with said coupling transistor device when said lens seat is disposed in said aligned position.

3. The image pickup module as recited in claim 2 further comprising a sealing glass sheet overlaying at least a portion of said upper surface of said image sensor housing package and being in contiguous contact therewith, one of said end faces of said connecting section being in contact with an upper face of said scaling glass sheet.

* * * * *